United States Patent [19]
Takeuchi et al.

[11] Patent Number: 5,774,961
[45] Date of Patent: Jul. 7, 1998

[54] METHOD OF PRODUCING PIEZOELECTRIC/ELECTROSTRICTIVE FILM ELEMENT

[75] Inventors: Yukihisa Takeuchi, Aichi-ken; Tsutomu Nanataki, Nagoya, both of Japan

[73] Assignee: NGK Insulators, Ltd., Japan

[21] Appl. No.: 694,280

[22] Filed: Aug. 8, 1996

Related U.S. Application Data

[62] Division of Ser. No. 365,129, Dec. 28, 1994, Pat. No. 5,600,197.

[30] Foreign Application Priority Data

| Feb. 14, 1994 | [JP] | Japan | 6-017697 |
| Feb. 22, 1994 | [JP] | Japan | 6-024174 |
| Aug. 11, 1994 | [JP] | Japan | 6-189203 |
| Oct. 5, 1994 | [JP] | Japan | 6-241172 |

[51] Int. Cl.[6] .................................................. H01L 41/22
[52] U.S. Cl. .................................. 29/25.35; 310/328
[58] Field of Search ............................ 29/25.35; 310/324, 310/328, 330, 358

[56] References Cited

U.S. PATENT DOCUMENTS

| 4,255,272 | 3/1981 | Ogawa | 252/629 |
| 4,751,013 | 6/1988 | Kaarmann et al. | 252/62.9 |
| 4,777,153 | 10/1988 | Sonuparlak et al. | 501/82 |
| 4,938,742 | 7/1990 | Smits | 604/67 |
| 5,089,455 | 2/1992 | Ketcham et al. | 501/104 |
| 5,126,615 | 6/1992 | Takeuchi et al. | 310/330 |
| 5,142,511 | 8/1992 | Kamai et al. | 310/338 |
| 5,210,455 | 5/1993 | Takeuchi et al. | 310/32.8 |
| 5,297,438 | 3/1994 | Alles et al. | |

FOREIGN PATENT DOCUMENTS

| 0 408 306 | 1/1991 | European Pat. Off. | 310/358 |
| 0 572 230 | 1/1993 | European Pat. Off. | 310/328 |
| 0 572 230 | 12/1993 | European Pat. Off. | B41J 2/14 |
| 0 606 767 | 7/1994 | European Pat. Off. | H01L 41/009 |
| 60-111600 | 6/1985 | Japan | H04R 17/00 |
| 62-213399 | 9/1987 | Japan | H04R 17/00 |
| 3-128681 | 5/1991 | Japan | H02N 2/00 |
| 4-083 139 | 3/1992 | Japan | 310/328 |
| 5-49270 | 2/1993 | Japan | H02N 2/00 |
| 5-270912 | 10/1993 | Japan | C04B 35/48 |
| 2161647 | 1/1986 | United Kingdom | H01L 41/18 |

OTHER PUBLICATIONS

Patent Abstracts of Japan, vol. 009, No. 266 (E–352), Oct. 23, 1985 & JP–A–60 111600 (Mitsubishi Kogyo Cement KK) Jun. 18, 1985.

"Introduction to Ceramics" by W. Kingery et al. pp. 518–521.

Primary Examiner—Carl E. Hall
Attorney, Agent, or Firm—Parkhurst & Wendel

[57] ABSTRACT

A piezoelectric/electrostrictive film element which includes a ceramic substrate having at least one window and an integrally formed diaphragm portion for closing each window, and a piezoelectric/electrostrictive unit including a lower electrode, a piezoelectric/electrostrictive layer and an upper electrode, which are formed in this order on the diaphragm portion. The piezoelectric/electrostrictive layer consists of a dense body having a crystal grain size of not smaller than 0.7 μm, and a porosity (x) of not greater than 15%, and the diaphragm portion has a deflection percentage (y) of 0–8%, which is a percentage of an amount of deflection of a central part of the diaphragm portion, with respect to a length of a shortest line which extends across the corresponding window and passes a center of the window. Further, the porosity (x) and the deflection percentage (y) satisfies the following formula: $y \leq 0.1167x^2 - 3.317x + 25.5$. Three methods for producing the piezoelectric/electrostrictive film element are described.

10 Claims, 5 Drawing Sheets

5,774,961

1

METHOD OF PRODUCING PIEZOELECTRIC/ELECTROSTRICTIVE FILM ELEMENT

This is a Division of application Ser. No. 08/365,129, filed Dec. 28, 1994, now U.S. Pat. No. 5,600,197.

BACKGROUND OF THE INVENTION

1. Field of the Invention

The present invention relates to a uni-morph, bi-morph or other type of piezoelectric or electrostrictive film element which generate or detect displacement or force in the form of bending, deflection or flexure, and which can be used for actuators, filters, display devices, transformers, microphones, sounding bodies (such as loudspeakers), various resonators, or vibrators, sensors, and other components or devices. The term "element" used herein is an element capable of transducing or converting electric energy into mechanical energy, i.e., mechanical force, displacement, strain or vibrations, or transducing such mechanical energy into electric energy.

2. Discussion of Related Art

In recent years, in the fields of optics and precision positioning or machining operations, for example, there have been widely used and increasingly demanded an element whose displacement is controlled for adjusting or controlling an optical path length or the position of a member or component of a device, on the order of fractions of a micron (μm), and a detecting element adapted to detect infinitesimal displacement of a subject as an electric change. To meet this need, there have been developed piezoelectric or electrostrictive film elements used for actuators or sensors, which elements comprise a piezoelectric material such as a ferroelectric material, and utilize the reverse or converse piezoelectric effect to produce a mechanical displacement upon application of an electric field to the piezoelectric material, or utilize the piezoelectric effect so as to produce an electric field upon application of a pressure or mechanical stress. Among these elements, a conventional uni-morph type piezoelectric/electrostrictive film element has been favorably used for a loudspeaker, for example.

There have been proposed ceramic piezoelectric/electrostrictive film elements used for various purposes, as disclosed in JP-A-3-128681 and JP-A-5-49270 filed by the assignee of the present application. An example of the disclosed elements has a ceramic substrate which has at least one window, and is formed integrally with a thin diaphragm which closes the window or windows so as to provide at least one thin-walled diaphragm portion. On an outer surface of each diaphragm portion of the ceramic substrate, there is formed a piezoelectric/electrostrictive unit (hereinafter referred to as P/E unit) which is an integral laminar structure consisting of a lower electrode, a piezoelectric/electrostrictive layer (hereinafter referred to as a P/E layer) and an upper electrode. This P/E unit is formed by a suitable film-forming method on the relevant diaphragm portion of ceramic substrate. The thus formed piezoelectric/electrostrictive film element is relatively small-sized and inexpensive, and can be used as an electromechanical transducer having high reliability. Further, this element has a quick operating response, and provides a relatively large amount of displacement by application of a low voltage, with a relatively large magnitude of force generated. Thus, the above-described element is advantageously used as a member for an actuator, filter, display device, sensor or other component or device.

2

To produce the piezoelectric/electrostrictive film element as described above, the lower electrode, P/E layer and upper electrode of each P/E unit are laminated in this order on the diaphragm portion of the ceramic substrate by a suitable film-forming method, and is subjected to heat treatment (firing) as needed, so that the P/E unit is formed integrally on the diaphragm portion. A further study of the inventors of the present invention revealed that the piezoelectric/electrostrictive characteristics of the piezoelectric/electrostrictive film element are deteriorated due to the heat treatment (firing) effected during the formation of the P/E unit, more specifically, the P/E layer.

That is, the P/E layer suffers from stresses due to firing shrinkage of the P/E layer or P/E unit which is in contact with the diaphragm portion of the ceramic substrate, during the heat treatment of the P/E layer. As a result, the P/E layer may not be sufficiently sintered due to the stresses, and still suffers from stresses remaining therein after the firing. In this case, the piezoelectric/electrostrictive film element cannot exhibit its inherent piezoelectric/electrostrictive characteristics.

In order to increase the sinterability and density of the P/E layer so as to improve the piezoelectric/electrostrictive characteristics of the film element, the firing temperature of the P/E layer may be increased, or the thickness of the diaphragm portion which bears the P/E layer thereon can be reduced. Yet these solutions are not sufficient to improve the density of the P/E layer, and the stresses remaining after firing of the P/E layer may deteriorate the piezoelectric/electrostrictive characteristics. In particular, such residual stresses may reduce the amount of displacement of the diaphragm portion upon actuation of the P/E unit. Further, the reduction in the thickness of the diaphragm portion makes it more difficult to produce the ceramic substrate.

The above-described conventional solutions may also cause a great amount of deflection of the diaphragm portion, which results in a reduced amount of displacement of the diaphragm portion upon actuation of the P/E unit. When two or more adjacent P/E units are actuated at the same time, in particular, the amount of displacement of these units are considerably reduced, as compared with the case where a single P/E unit is actuated. Due to the great amount of deflection of the diaphragm portion, the piezoelectric/electrostrictive film element may break during manufacture or use of the element, resulting in reduced operating operation reliability.

SUMMARY OF THE INVENTION

It is therefore a first object of the present invention to provide a piezoelectric/electrostrictive film element wherein each piezoelectric/electrostrictive unit is formed by a film-forming method on an outer surface of a thin-walled diaphragm portion of a ceramic substrate, and wherein the piezoelectric/electrostrictive layer formed on the diaphragm portion exhibits high sinterability or density without being affected by the diaphragm portion, assuring high reliability and high electromechanical conversion efficiency of the film element.

It is a second object of the invention to provide a method of producing such a piezoelectric/electrostrictive element that has excellent characteristics as described above.

The above-indicated first object may be accomplished according to a first aspect of the present invention, which provides a piezoelectric/electrostrictive film element comprising: a ceramic substrate having at least one window, and a diaphragm portion for closing each window, the diaphragm portion being formed as an integral part of the ceramic substrate; and a piezoelectric/electrostrictive unit including a lower electrode, a piezoelectric/electrostrictive layer and an upper electrode, which are formed in the order of description on an outer surface of the diaphragm portion by a film-forming method, to provide a laminar structure, the piezoelectric/electrostrictive layer consisting of a dense body having a crystal grain size of not smaller than 0.7 μm, and a porosity (x) of not greater than 15%, the diaphragm portion having a deflection percentage (y) of 0–8%, which is a percentage of an amount of deflection of a central part of the diaphragm portion, with respect to a length of a shortest line which extends across the corresponding window and passes a center of the window, the porosity (x) and the deflection percentage (y) satisfying the following formula: $y \leq 0.1167x^2 - 3.317x + 25.5$.

In the piezoelectric/electrostrictive film element constructed as described above, the diaphragm portion of the ceramic substrate undergoes a reduced amount of deflection, and the piezoelectric/electrostrictive layer exhibits high sinterability, assuring improved operating reliability of the element. The reduced deflection of the diaphragm portion leads to an increased amount of displacement thereof with a relatively small force generated by the piezoelectric/electrostrictive unit. Further, the piezoelectric/electrostrictive layer having high sinterability generates a relatively large force, which leads to an increased amount of displacement. Thus, the present piezoelectric/electrostrictive film element exhibits excellent piezoelectric/electrostrictive characteristics.

Where a plurality of piezoelectric/electrostrictive units of the present film element are concurrently activated, the amount of displacement is not reduced as compared with the case where only one piezoelectric/electrostrictive unit is activated. Thus, the amount of displacement does not vary depending upon the state of actuation of the piezoelectric/electrostrictive unit(s), assuring high uniformity in the displacement characteristic and quality of the film element. Further, the present piezoelectric/electrostrictive element is less likely to break during its production or use, assuring effectively improved reliability.

The piezoelectric/electrostrictive film element as described above may be produced by one of the following three methods (A)–(C), assuring a high electromechanical conversion efficiency and high sinterability of the obtained element.

The second object of the present invention may be accomplished according to a second aspect of the invention, which provides (A) a method of producing a piezoelectric/electrostrictive film element including: a ceramic substrate having at least one window, and a diaphragm portion for closing each window, the diaphragm portion being formed as an integral part of the ceramic substrate; and a piezoelectric/electrostrictive unit including a lower electrode, a piezoelectric/electrostrictive layer and an upper electrode, which are formed in the order of description on an outer surface of the diaphragm portion to provide a laminar structure, comprising the steps of: (a) preparing the ceramic substrate in which the diaphragm portion protrudes outwards to provide a convex diaphragm portion; (b) forming the lower electrode and the piezoelectric/electrostrictive layer on an outer surface of the convex diaphragm portion by a film-forming method; (c) firing the piezoelectric/electrostrictive layer so that the convex diaphragm portion is depressed into the window; and (d) forming the upper electrode on the piezoelectric/electrostrictive layer by a film-forming method.

The second object of the present invention may also be accomplished according to a third aspect of the invention, which provides (B) a method of producing a piezoelectric/electrostrictive film element including: a ceramic substrate having at least one window, and a diaphragm portion for closing each window, the diaphragm portion being formed as an integral part of the ceramic substrate; and a piezoelectric/electrostrictive unit including a lower electrode, a piezoelectric/electrostrictive layer and an upper electrode, which are formed in the order of description on an outer surface of the diaphragm portion to provide a laminar structure, comprising the steps of: (a) preparing the ceramic substrate; (b) forming the lower electrode and the piezoelectric/electrostrictive layer on the outer surface of the diaphragm portion by a film-forming method, the piezoelectric/electrostrictive layer including a ceramic powder which fills at least 60% of the piezoelectric/electrostrictive layer before firing thereof; (c) firing the piezoelectric/electrostrictive layer; and (d) forming the upper electrode on the piezoelectric/electrostrictive layer by a film-forming method.

The second object may also be accomplished according the a fourth aspect of the present invention, which provides (C) a method of producing a piezoelectric/electrostrictive film element including: a ceramic substrate having at least one window, and a diaphragm portion for closing each window, the diaphragm portion being formed as an integral part of the ceramic substrate; and a piezoelectric/electrostrictive unit including a lower electrode, a piezoelectric/electrostrictive layer and an upper electrode, which are formed in the order of description on an outer surface of the diaphragm portion to provide a laminar structure, comprising the steps of: (a) preparing the ceramic substrate in which the diaphragm portion protrudes outwards to provide a convex diaphragm portion; (b) forming the lower electrode and the piezoelectric/electrostrictive layer on an outer surface of the convex diaphragm portion by a film-forming method, the piezoelectric/electrostrictive layer including a ceramic powder which fills at least 60% of the piezoelectric/electrostrictive layer before firing thereof; (c) firing the piezoelectric/ electrostrictive layer so that the convex diaphragm portion is depressed into the corresponding window; and (d) forming the upper electrode on the piezoelectric/electrostrictive layer by a film-forming method.

BRIEF DESCRIPTION OF THE DRAWINGS

The above and optional objects, features and advantages of the present invention will be better understood by reading the following detailed description of preferred embodiments of the invention, when considered in connection with the accompanying drawings, in which.

DETAILED DESCRIPTION OF THE PREFERRED EMBODIMENTS

Figure 1:
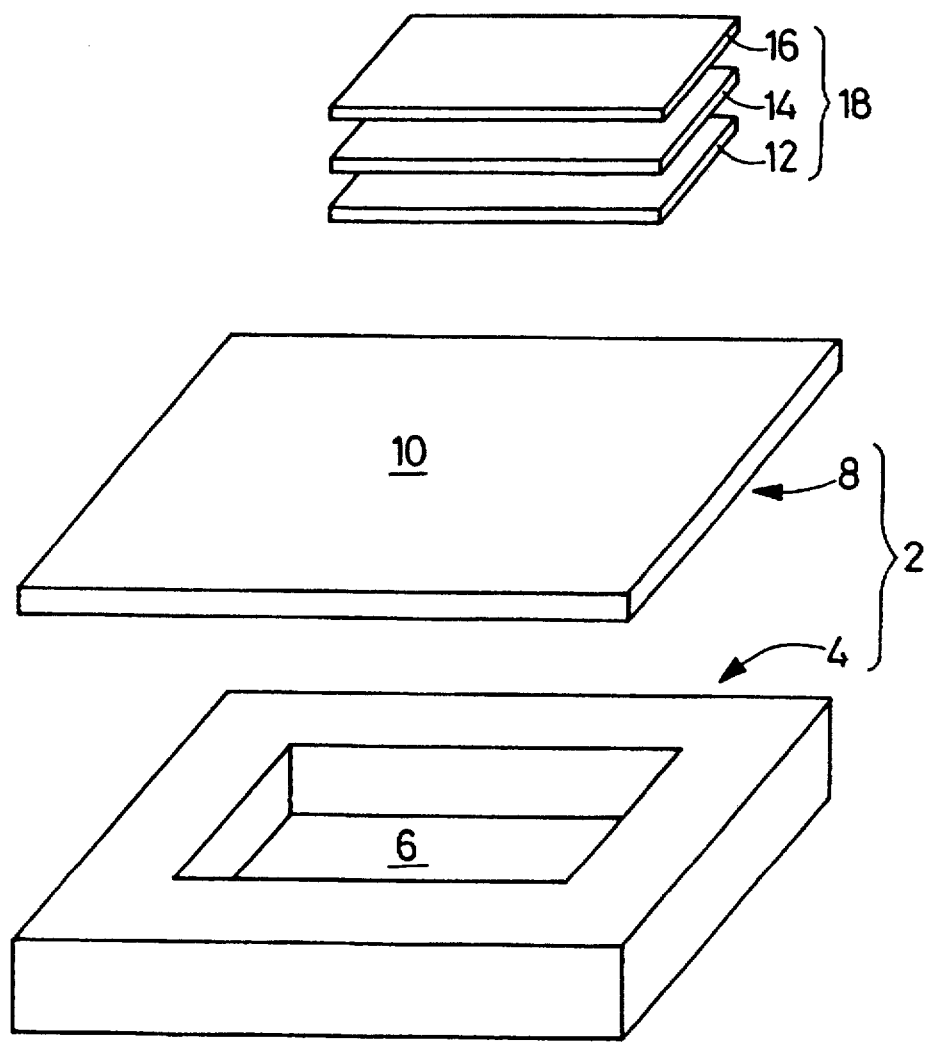
FIG. 1 is an exploded perspective view showing one example of a basic structure of a piezoelectric/electrostrictive film element constructed according to the present invention.
Figure 2:
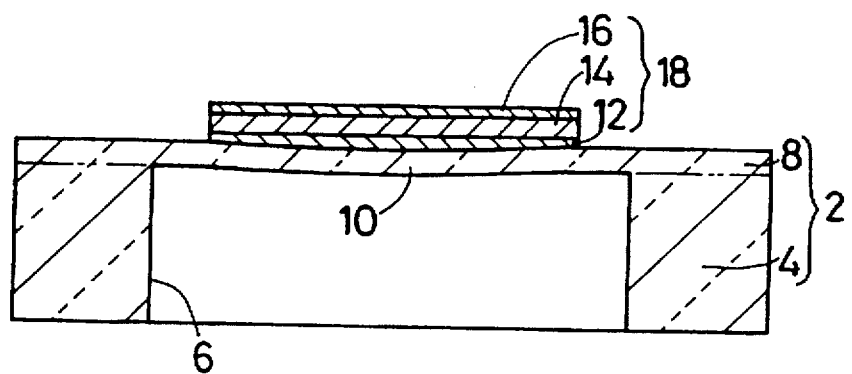
FIG. 2 is a cross sectional view of the piezoelectric/electrostrictive film element of FIG. 1.

Referring to FIGS. 1 and 2 showing one example of a basic structure of a piezoelectric/electrostrictive film element as one embodiment of the present invention, a ceramic substrate 2 has an integral structure which consists of a base plate 4 having a rectangular window 6 of a suitable size, and a relatively thin diaphragm plate 8 for closing the window 6. The diaphragm plate 8 is superposed on one of opposite major surfaces of the base plate 4 which serves as a support member. The diaphragm plate 8 has a diaphragm portion 10 which corresponds to the window 6 of the base plate 4. On an outer surface of the diaphragm portion 10 of the planar ceramic substrate 2, a lower electrode film 12, a piezoelectric/electrostrictive layer (hereinafter referred to as P/E layer) 14 and an upper electrode film 16 are laminated in this order, so as to form a film-like piezoelectric/electrostrictive unit (hereinafter referred to as P/E unit) 18. As known in the art, a suitable voltage is applied to the lower and upper electrodes 12, 16, through respective lead portions (not shown).

Where the piezoelectric/electrostrictive film element constructed as described above is used as an actuator, a voltage is applied between the two electrodes 12, 16 of the P/E unit 18 in a known manner, so that the P/E layer 14 is exposed to an electric field, and undergoes a mechanical distortion induced by the electric field. Consequently, the P/E unit 18 causes bending or deflecting displacement or force due to the transverse effect of the distortion of the P/E layer 14, such that the displacement or force acts on the ceramic substrate 2 (diaphragm portion 10) in a direction perpendicular to the planar surface of the substrate 2.

Figure 3:
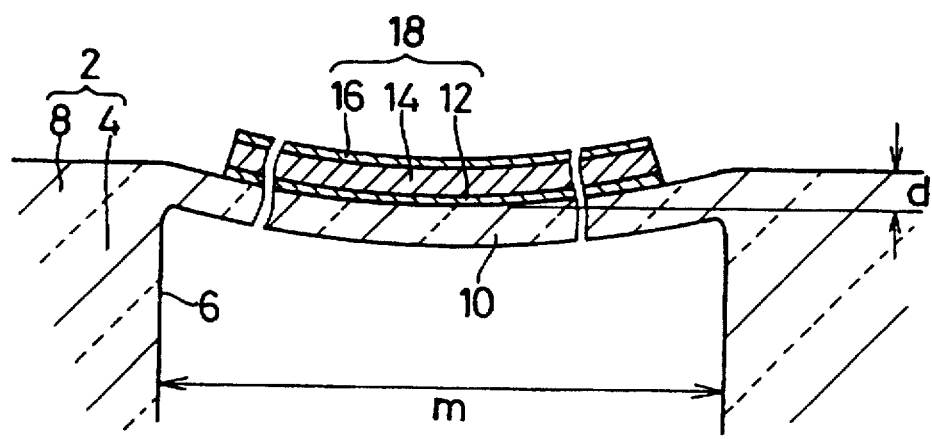
FIG. 3 is an enlarged view showing a cross section of the film element of FIG. 1, which is taken along the shortest path passing the center of a window (the shorter side of the window)

In the present piezoelectric/electrostrictive film element, the P/E layer 14 consists of a dense body having the crystal grain size of 0.7 μm or greater and the porosity (x) of 15% or smaller. At the same time, the diaphragm portion 10 of the ceramic substrate 2 is deflected, as shown in FIG. 3, such that the ratio of the maximum amount of deflection (d) of a central part of the diaphragm portion 10 to the length (m) of the shortest line which extends across the window 6 of the substrate 2 and passes the center of the window 6, in other words, deflection percentage as represented by [y=(d/m)× 100], is held within a range of 0–8%. Further, the porosity (x) and the deflection percentage (y) are determined so as to satisfy the following formula (1):

$$y \leq 0.1167x^2 - 3.317x + 25.5 \qquad (1)$$

The thus obtained piezoelectric/electrostrictive film element has effectively improved piezoelectric/electrostrictive characteristics, and undergoes a relatively large displacement with improved electromechanical conversion efficiency. Further, the present P/E film element is free of breakage and other defects, assuring improved operating reliability.

The dense body for the P/E layer 14 is formed by firing a suitable piezoelectric/electrostrictive material, and has a crystal grain size which is controlled to be 0.7 μm or greater, preferably, 1.5 μm or greater, and more preferably, 2.0 μm or greater. If the crystal grain size is too small, the piezoelectric/electrostrictive characteristics of the P/E film element are deteriorated. It is also difficult for the P/E film element to exhibit sufficient piezoelectric/electrostrictive characteristics if the porosity (x) of the dense body of the P/E layer 14 exceeds 15%.

Further, the deflection percentage (y), that is, the percentage of the amount of deflection (d) of the central part of the diaphragm portion 10 with respect to the length (m) of the shortest line which passes the center of the window 6, as represented by (d/m)×100 (%), needs to be held within a range of 0% (no deflection) to 8%. If the amount of deflection (d) of the diaphragm portion 10 is too large, it becomes difficult to achieve a sufficiently large amount of displacement or high electromechanical conversion efficiency when the P/E unit 18 is actuated by application of a voltage thereto.

Moreover, the porosity (x) and deflection percentage (y) as indicated above need to satisfy the above-indicated formula (1). If the formula (1) is not satisfied, the present P/E film element cannot provide excellent piezoelectric/electrostrictive characteristics. Preferably, the porosity (x) and deflection percentage (y) are determined so as to satisfy the following formula (2):

$$y \leq 0.2x^2 - 3.9x + 20.5 \qquad (2)$$

(where $x \leq 10$, $0 \leq y \leq 6$)

More preferably, the porosity (x) and deflection percentage (y) are determined so as to satisfy the following formula (3):

$$y \leq -x + 7 \qquad (3)$$

(where $x \leq 6$, $0 \leq y \leq 3$)

The ceramic substrate 2 which bears the P/E unit 18 thereon is made of a known ceramic material, and is favorably selected from stabilized zirconia, partially stabilized zirconia, alumina and mixtures thereof. Particularly favorably used is a material as disclosed by the present inventors in JP-A-5-270912, which contains as a major component zirconia which is partially stabilized by adding a compound(s), such as yttrium oxide, and which has a crystal phase that consists essentially of a tetragonal phase or a combination or mixture of at least two kinds of cubic, tetragonal and monoclinic phases. The crystal grain size of the ceramic substrate 2 is preferably controlled to be not greater than 1 μm. The ceramic substrate 2 made of the above-described material exhibits high mechanical strength and high toughness even with a small thickness, and is less likely to chemically react with the piezoelectric/electrostrictive material. The ceramic substrate 2 is preferably produced by 1) preparing a green sheet which gives the base plate 4 and which is formed with an aperture (window 6) by use of a metal mold or by ultrasonic machining or mechanical machining, 2) superposing a thin green sheet which gives the diaphragm plate 8 (diaphragm portion 10) on the green sheet for the base plate 4 and bonding the green sheets together by thermo compression, and 3) firing the green sheets into an integral structure. The ceramic substrate 2 thus obtained exhibits high reliability. The thickness of the diaphragm portion 10 of the ceramic substrate 2 is generally 50 μm or smaller, preferably in the range of 1 μm–30 μm, and more preferably in the range of 3 μm–15 μm.

Each of the green sheets for the base plate 4 and diaphragm plate 8 may consist of a plurality of thin sheets which are superposed on each other, while the window 6 of the ceramic substrate 2 or the diaphragm portion 10 has a rectangular shape in the present embodiment, the shapes of the window 6 may be suitably selected from other shapes, such as a circular, polygonal or elliptical shape, or combination of these shapes, depending upon the application or utility of the piezoelectric/electrostrictive film element. Where the window 6 has a circular shape, rectangular shape or elliptical shape for example, the above-identified length (m) of the shortest line which passes the center of the window 6 corresponds to the diameter of the circle, the length of a shorter side of the rectangle, or the length of minor axis of the ellipse, respectively.

The above-indicated electrodes 12, 16 and the P/E layer 14 are formed by a suitable film-forming method on the diaphragm portion 10 of the ceramic substrate 2 as described above, thereby to provide the P/E unit 18. The P/E layer 14 is suitably formed by a thick-film forming method, such as screen printing, spraying, coating or dipping. The thick-film forming method utilizes a paste or slurry which contains as a main component piezoelectric/electrostrictive ceramic particles having the average particle size of about 0.01 µm to 7 µm, preferably, about 0.05 µm to 5 µm, so as to form the film-like P/E layer 14 on the diaphragm portion 10 of the ceramic substrate 2. In this case, the resultant film element exhibits excellent piezoelectric/electrostrictive characteristics. Among the above-indicated thick-film forming methods, screen printing is particularly favorably employed since it permits fine patterning at a relatively low cost. It is desirable that the thickness of the P/E layer 14 be not greater than 50 µm, and more preferably in the range of 3 µm to 40 µm, to obtain a relatively large displacement of the P/E layer 14 with a relatively low voltage.

The upper and lower electrodes 16, 12 of the P/E unit 18 are formed of an electrically conductive material which can withstand oxidizing atmospheres having a considerably high temperature. For instance, the electrodes 12, 16 may be formed of a single metal, an alloy of metals, a mixture of a metal or alloy and an electrically insulating ceramic, or an electrically conductive ceramic. However, the electrode material preferably has a major component which consists of a noble metal having a high melting point, such as platinum, palladium or rhodium, or an alloy, such as silver-palladium alloy, silver-platinum alloy or platinum-palladium alloy. The electrodes 12, 16 may also be formed of a cermet of platinum, and the ceramic material for the substrate 2 or the piezoelectric/electrostrictive material for the layer 14. More preferably, the electrodes 12, 16 are made solely of platinum, or include as a major component of an alloy containing platinum. Where the above-described cermets are used, the content of the substrate material is preferably held within the range of about 6–30% by volume, while the piezoelectric/electrostrictive material is preferably held within the range of about 5–20% by volume.

The electrodes 12, 16 are formed, using the above-described conductive material, by a suitably selected one of known film-forming methods which include the thick-film forming methods as indicated above, and thin-film forming methods, such as sputtering, ion-beam method, vacuum vapor deposition, ion plating, CVD and plating. Among these methods, the thick-film forming method such as screen printing, spraying, dipping and coating, are favorably employed for forming the electrodes 12, 16. For forming the upper electrode 16, the thin-film forming methods as mentioned above may be preferably employed as well as the thick-film forming method. The thickness of the electrodes 12, 16 thus formed is generally not greater than 20 µm, preferably, not greater than 5 µm. The total thickness of the P/E unit 18 which is the sum of the thickness of these electrodes 12, 16 and the P/E layer 14 is generally 100 µm or smaller, preferably, 50 µm or smaller.

The piezoelectric/electrostrictive material for forming the P/E layer 14 of the P/E unit 18 preferably contains as a major component lead zirconate titanate (PZT), lead magnesium niobate (PMN), lead nickel niobate (PNN), lead manganese niobate, lead antimony stannate, lead zinc niobate, lead titanate, lead magnesium tantalate, lead nickel tantalate, or a mixture thereof. Further, a material (such as PLZT) containing an oxide or other compound of lanthanum, barium, niobium, zinc, cerium, cadmium, chromium, cobalt, antimony, iron, yttrium, tantalum, tungsten, nickel, manganese, lithium, strontium, or bismuth may be added as needed to the above-indicated piezoelectric/electrostrictive material.

Among the piezoelectric/electrostrictive materials as indicated above, it is recommended to use a material which includes as a major component one of the following mixtures: a mixture of lead magnesium niobate, lead zirconate and lead titanate; a mixture of lead nickel niobate, lead magnesium niobate, lead zirconate and lead titanate; a mixture of lead magnesium niobate, lead nickel tantalate, lead zirconate and lead titanate; and a mixture of lead magnesium tantalate, lead magnesium niobate, lead zirconate and lead titanate. These piezoelectric/electrostrictive materials are recommended when the P/E layer 14 is formed by a thick-film forming method, such as screen printing. When the piezoelectric/electrostrictive material having three or more components is used, its piezoelectric/electrostrictive characteristics vary depending upon the composition of the components of the material. However, a three-component material composed of lead magnesium niobate, lead zirconate and lead titanate, or a four-component material composed of lead magnesium niobate, lead nickel tantalate, lead zirconate and lead titanate, or a four-component material composed of lead magnesium tantalate, lead magnesium niobate, lead zirconate and lead titanate preferably has a composition in the vicinity of phase boundaries of a pseudo-cubic crystal phase, a tetragonal crystal phase and a rhombohedral crystal phase. To assure sufficiently high piezoelectric constant and electromechanical coupling factor, it is particularly desirable to employ one of the following compositions, that is, 1) a composition containing 15–50 mol % of lead magnesium niobate, 10–45 mol % of lead zirconate, and 30–45 mol % of lead titanate, 2) a composition containing 15–50 mol % of lead magnesium niobate, 10–40 mol % of lead nickel tantalate, 10–45 mol % of lead zirconate and 30–45% of lead titanate, or 3) a composition containing 15–50 mol % of lead magnesium niobate, 10–40 mol % of lead magnesium tantalate, 10–45 mol % of lead zirconate and 30–45 mol % of lead titanate.

The electrode films and P/E layer (12, 16, 14) formed on the outer surface of the diaphragm portion 10 of the ceramic substrate 2 as described above may be either heat-treated (fired) in different steps after each of these films and layer is formed, for integration with the substrate 2, or concurrently heat-treated (fired) in a single step for integration with the substrate 2 after all of the films and layer are formed on the diaphragm portion 10. Further, the above heat-treatment (firing) of the electrode films (12, 16) may not be required depending upon the method of forming these films. The temperature of the heat treatment (firing) for integration of the electrode films and P/E layer with the diaphragm portion is generally controlled to be in the range of 500° C. to 1400° C., preferably, in the range of 1000° C. to 1400° C. To avoid changes in the composition of the piezoelectric/ electrostrictive material of the P/E layer 14 at a high temperature, it is desirable to heat-treat or fire the P/E layer 14 while controlling the firing atmosphere to include the evaporation source of the piezoelectric/electrostrictive material. It is also recommended to fire the P/E layer 14 while it is covered with a suitable covering member so that the surface of the layer 14 is not directly exposed to the firing atmosphere. The covering member may be formed of a material similar to that of the ceramic substrate 2.

The piezoelectric/electrostrictive film element constructed as described above is advantageously produced by one of the following three methods (A)–(C) according to the present invention.

Figure 4A:
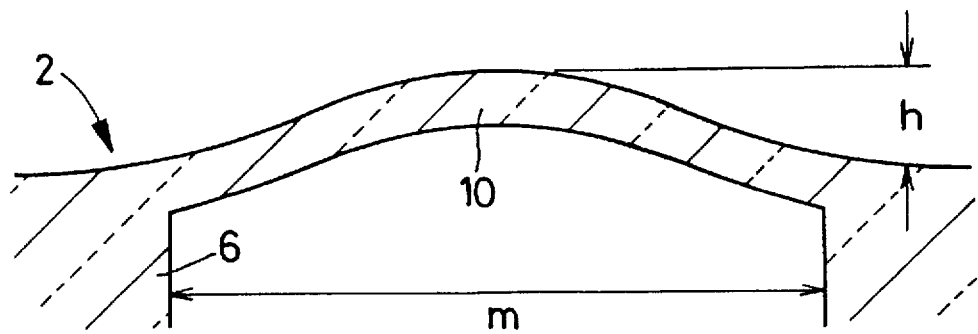
FIG. 4(a) is an enlarged view in partial cross section, showing one process step of a method of producing the piezoelectric/electrostrictive element of the present invention.
Figure 4B:
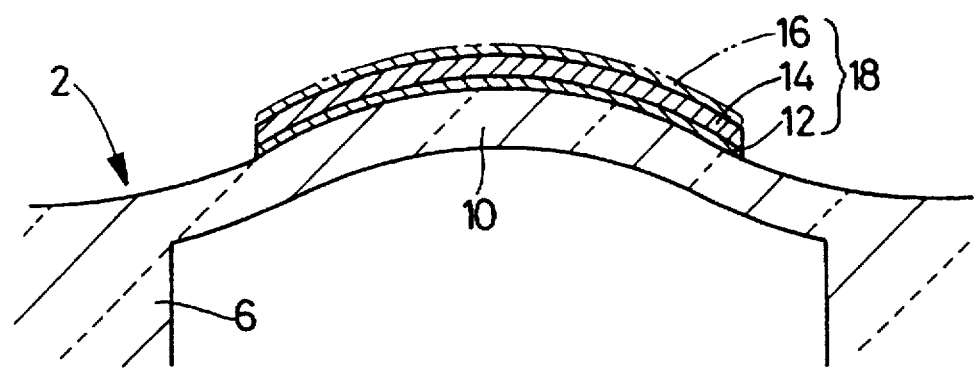
FIG. 4(b) is a view corresponding to FIG. 4(a), showing another process step of the method of producing the film element.
Figure 4C:
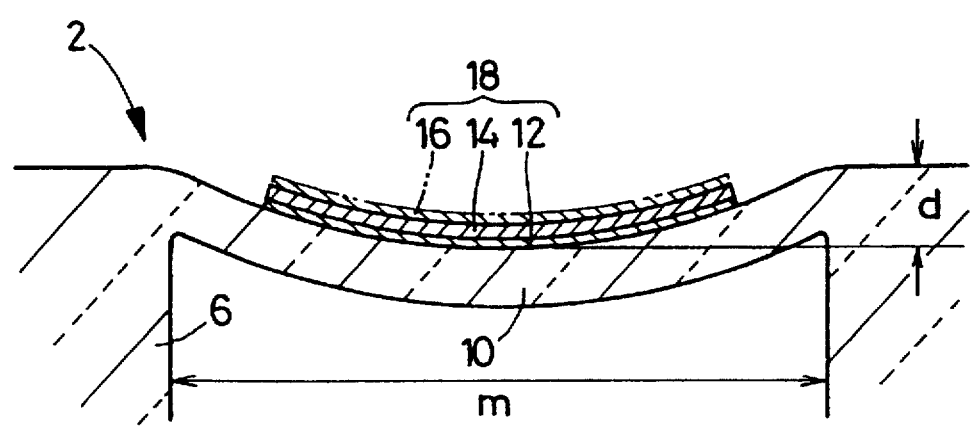
FIG. 4(c) is a view corresponding to FIG. 4(a), showing a further process step of the method of producing the film element.

In the method (A), the ceramic substrate 2 is prepared such that its diaphragm portion 10 has a convex shape, that is, protrudes outward, away from the window 6 by an amount "h" as indicated in FIG. 4(a). After the ceramic substrate 2 is fired, the lower electrode 12 and P/E layer 14 are successively laminated on the outer surface of the convex diaphragm portion 10, by a suitable film-forming method, as shown in FIG. 4(b). When the P/E layer 14 is fired after the upper electrode 18 is formed as needed, the P/E layer 14 has greater firing shrinkage than the diaphragm portion 10 which has been fired, whereby the diaphragm portion 10 is depressed into the window 6, as shown in FIG. 4(c). In the P/E unit 18, therefore, stresses caused by the firing shrinkage of the P/E layer 14 can be effectively reduced, while assuring improved density of the P/E layer 14, whereby the resulting film element exhibits effectively improved piezoelectric/electrostrictive characteristics.

That is, in order to satisfactorily achieve sintering of the P/E layer 14 formed via the lower electrode 12 on the diaphragm portion 10 which has been fired, the inventors found it effective to depress the convex diaphragm portion 10 into the window 6 due to the firing shrinkage of the P/E layer 14, so as to substantially reduce the area of contact of the P/E layer 14 with the surface of the diaphragm portion 10 or lower electrode 12. This leads to sufficiently increased density and reduced residual stresses of the P/E layer 14, assuring excellent characteristics of the resultant piezoelectric/electrostrictive film element.

An effect of the coercive field produced by the piezoelectric/electrostrictive material of the P/E layer 14 upon application of an voltage should be considered in connection with amount of displacement of the P/E layer. To achieve sufficiently large displacement of the P/E layer 14, a voltage needs to be applied in a direction of shrinkage of the P/E layer 14, parallel to the plane of the diaphragm portion 10, so that the P/E layer 14 is exposed to an electric field in the direction of polarization. As a result, the P/E layer 14, upon its actuation, is displaced or bent downwards, that is into the window 6 of the ceramic substrate 2. If the piezoelectric/electrostrictive film element is shaped such that the diaphragm portion 10 protrudes outwards, away from the window 6, the P/E layer 14 has relatively large rigidity as measured in a direction opposite to its bending direction, resulting in an undesirably reduced amount of displacement. Accordingly, it is desirable to depress the diaphragm portion 10 into the window 6 such that the deflection percentage is held in a range of 0–8%.

The ceramic substrate 2 used in the above-described method (A), which has the convex diaphragm portion 10 that protrudes outwards, can be easily obtained by controlling the firing rate or speed or the shrinkage percentage of the base plate 4 and diaphragm plate 8 (FIGS. 1 and 2), suitably adjusting the configuration of the diaphragm plate 8 before firing thereof, or utilizing the difference in thermal-expansion ratio between the two plates 4, 8. More specifically, the diaphragm portion 10 protrudes outwards when sintering of a green sheet which gives the diaphragm plate 8 precedes sintering of a green sheet which gives the base plate 4, or when the shrinkage percentage caused by sintering of the green sheet for the base plate 4 is greater than that of the green sheet for the diaphragm plate 8.

The amount "h" of protrusion of the diaphragm portion 10 of the ceramic substrate 2 is generally 1–20% of the above-indicated length (m) of the shortest line which passes the center of the window 6, preferably 2–10% of the same length (m). If the protrusion amount "h" is too small, the amount of deflection of the diaphragm portion 10 may become excessively large, when the P/E layer 14 is fired. If the protrusion amount "h" is too large, it may be difficult to depress the diaphragm portion 10 into the window 6 upon firing of the P/E layer 14.

In the method (B) for producing the piezoelectric/electrostrictive film element, the ceramic substrate 2 is initially prepared, and the lower electrode 12 and the P/E layer 14 are laminated by a suitable film-forming method on the outer surface of the diaphragm portion 10 of the substrate 2. The thus formed P/E layer 14 includes a ceramic powder (powder of a piezoelectric/electrostrictive material) which fills 60% of an entire green body for the P/E layer 14. Then, the P/E layer 14 is fired after the upper electrode 16 is formed as needed. Thus, the percentage of the ceramic powder which fills the green body for the P/E layer before firing is increased so as to effectively reduce stresses caused by shrinkage of the P/E layer 14 upon its firing. Consequently, the diaphragm portion 10 has reduced deflection, and the resulting film element exhibits improved piezoelectric/electrostrictive characteristics, in particular, provides a relatively large amount of displacement with a relatively small force generated by the P/E layer 14.

The ceramic substrate used in this method (B) need not have a convex diaphragm portion as used in the above method (A), but may employ an ordinary flat diaphragm portion. The ceramic substrate with the flat diaphragm portion can be easily produced by forming green sheets for the base plate and diaphragm plate using the same material, and thermo-compressing and firing the green sheets into an integral ceramic body.

In the above-described method (B), the ceramic powder or powder of the piezoelectric/electrostrictive material fills 60% or more, preferably 65% or more, and more preferably 70% or more of the green body for the P/E layer 14 before its firing, so as to reduce the stresses which occur due to shrinkage of the P/E layer 14 upon its firing. If the percentage of filling is smaller than 60%, the stresses occurring upon firing of the P/E layer 14 cannot be sufficiently reduced, whereby the film element cannot achieve sufficient or intended improvements in its piezoelectric/electrostrictive characteristics.

To produce the piezoelectric/electrostrictive element by the method (C) of the present invention, the ceramic substrate 2 is initially prepared such that its diaphragm portion 10 protrudes outwards to form a convex shape, as in the method (A), and the lower electrode 12 and P/E layer 14 are then formed in lamination on the outer surface of the convex diaphragm portion 10 of the substrate 2, by a suitable film-forming method. The P/E layer 14 thus formed contains a ceramic powder which fills 60% or more of the green body for the layer 14, in the same manner as in the method (B). Then, the P/E layer 14 is fired after forming the upper electrode as needed, so that the diaphragm portion 10 is depressed into the window 6 of the ceramic substrate 2.

This method (C) is a combination of the method (A) and (B), and the amount of protrusion (h) of the diaphragm portion 10 and the percentage of filling of the ceramic powder in the P/E layer 14 are controlled to the respective ranges specified above in relation to the methods (A) and (B).

In the above-described methods (A), (B) and (C), the lower electrode film, P/E layer and upper electrode film 12, 14, 16 are formed on the outer surface of the diaphragm portion 10 of the ceramic substrate 2, by the above-indicated film-forming method(s), and then fired at the above-indicated firing temperature, thereby to provide respective films and layer having desired thickness values. Thus, the P/E unit 18 is formed integrally on the diaphragm portion 10. While it is desirable to fire the P/E layer 14 just after it is formed on the lower electrode 12, that is, before the upper electrode 16 is formed, the firing of the P/E layer 14 may be effected after the upper electrode 16 is formed on the layer 14.

The piezoelectric/electrostrictive film element having excellent piezoelectric/electrostrictive characteristics and other advantageous features arising from the present invention can be produced by employing any one of the above-described methods (A), (B) and (C).

In the piezoelectric/electrostrictive film element thus obtained according to the present invention, the diaphragm portion 10 of the ceramic substrate 2 has an advantageously reduced amount of deflection or flexure, and the P/E layer 14 of the P/E unit 18 has increased density. Accordingly, the film element exhibits excellent piezoelectric/electrostrictive characteristics with high reliability, and the amount of displacement of each P/E unit obtained when two or more adjacent P/E units are concurrently activated is almost equal to that obtained when only one P/E unit is activated.

While the piezoelectric/electrostrictive film element as described above may be used for various applications, such as sensors and actuators, the present film element is advantageously used as a piezoelectric/electrostrictive actuator since the element effectively undergoes displacement upon actuation of the P/E unit formed on the outer surface of the diaphragm portion. For example, the P/E film element of the present invention is advantageously used as a uni-morph, bi-morph or other type of piezoelectric/electrostrictive actuator used for servo-displacement elements, pulse-driven motors and ultrasonic motors, for example, as described in "FUNDAMENTALS TO APPLICATIONS OF P/EZOELECTRIC/ELECTROSTRICTIVE ACTUATORS", Kenji Uchino, Japan Industrial Technology Center. The present P/E film element may also be used for filters, various sensors, such as acceleration sensors or shock sensors, transformers, microphones, sounding bodies (such as loudspeakers), and various resonators and vibrators for power devices and communication devices.

Figure 5:
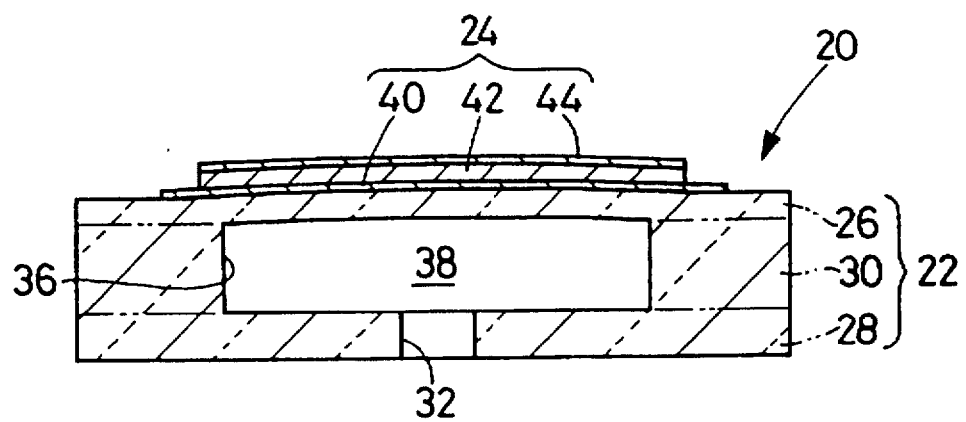
FIG. 5 is a cross sectional view showing another embodiment of the piezoelectric/electrostrictive film element of the present invention.
Figure 6:
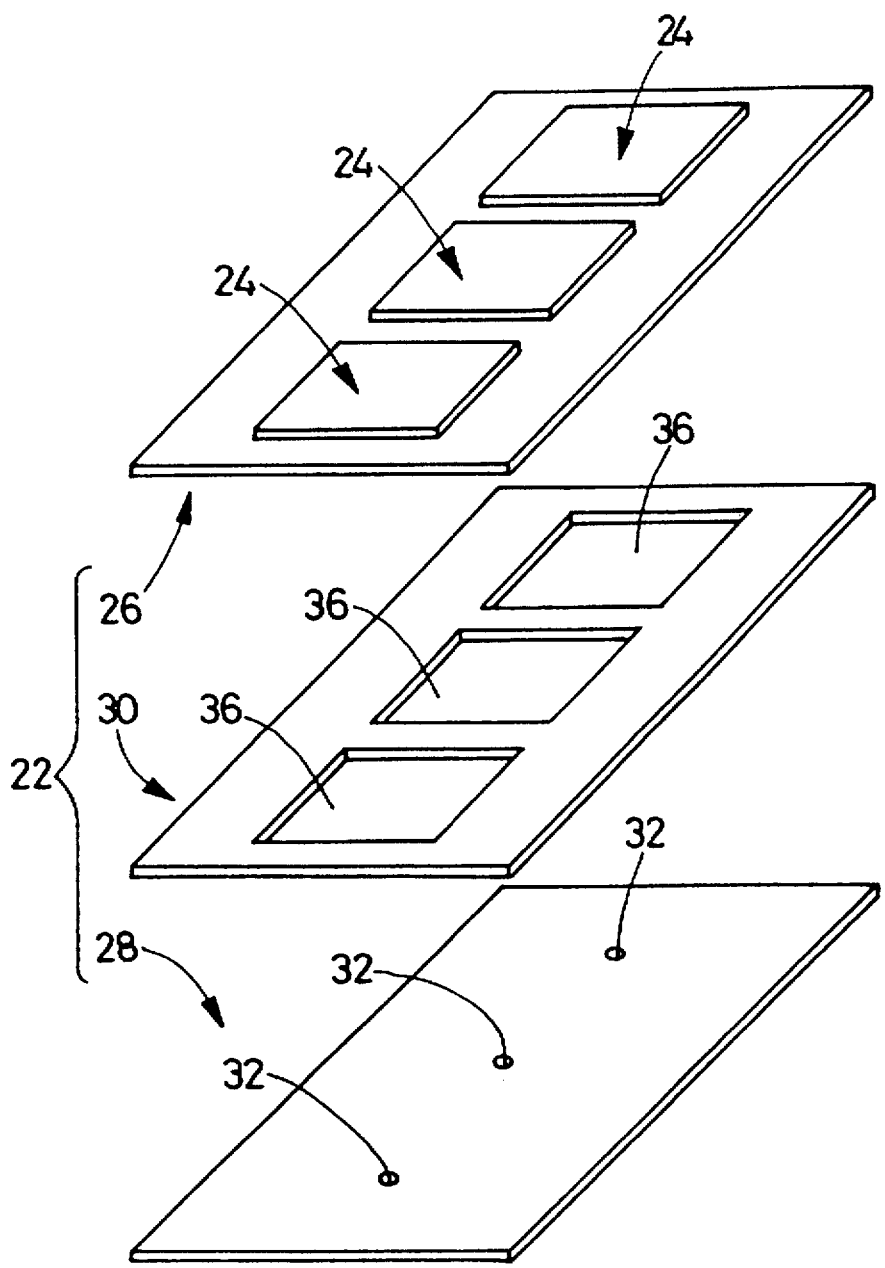
FIG. 6 is an exploded perspective view showing the piezoelectric/electrostrictive film element shown in FIG. 5.

Referring next to FIG. 5 schematically showing an example of a piezoelectric/electrostrictive film element according to the present invention, and to FIG. 6 which is an exploded perspective view of the film element, the piezoelectric/electrostrictive film element 20 has an integral structure which includes a ceramic substrate 22 and a plurality of piezoelectric/electrostrictive units (hereinafter referred to as P/E units) 24 formed on outer surfaces of thin-walled diaphragm portions of the substrate 22. In operation, each of the diaphragm portions of the ceramic substrate 22 is deflected or deformed upon application of a voltage to the corresponding P/E unit 24.

More specifically, the ceramic substrate 22 has an integral laminar structure which consists of a relatively thin closure plate (diaphragm plate) 26, a connecting plate (base plate) 28, and a spacer plate (base plate) 30 interposed between the closure and spacer plate 26, 30. These plates 26, 28, 30 are formed of a zirconia material. The connecting plate 28 has three communication holes 32 formed through the thickness thereof. The number, shape, size and position of the communication holes 32 may be suitably determined depending upon application or use of the piezoelectric/electrostrictive film element. The spacer plate 30 has a plurality of square windows 36 (three in this embodiment) formed therethrough, and is superposed on the connecting plate 28 such that the respective communication holes 32 of the connecting plate 28 communicate with the corresponding windows 36. The closure plate 26 is superposed on one major surface of the spacer plate 30 remote from the connections plate 28, so as to close openings of the windows 36 of the spacer plate 30. With the closure plate 26, spacer plate 30 and connecting plate 28 thus superposed on each other, three pressure chambers 38 are formed within the ceramic substrate 22, such that the chambers 38 communicate with an exterior space through the respective communication holes 32. The ceramic substrate 22 is an integral fired body formed of a suitable ceramic material, such as a zirconia material, as described above. While the ceramic substrate 22 has a three-layer structure including the closure plate (diaphragm plate), spacer plate (base plate) and connecting plate (base plate), the substrate 22 may have a four-layer or other multi-layer structure.

Film-like P/E units 24 are formed on the outer surface of the closure plate 26, such that the units 24 are aligned with the respective pressure chambers 38 as viewed in the plane parallel to the closure plate 26. Each of the P/E units 24 includes a lower electrode 40, a piezoelectric/electrostrictive layer (hereinafter referred to as P/E layer) 42, and an upper electrode 44, which are successively formed by a suitable film-forming method or methods on a portion of the closure plate 26 which is located in alignment with one of the windows 36 of the spacer plate 30, that is, on the outer surface of one diaphragm portion of the ceramic substrate 22. In operation, the pressure in the pressure chamber 38 is increased upon actuation of the corresponding P/E unit 24, so that a fluid contained in the pressure chamber 38 can be effectively discharged through the corresponding communication hole 32. The thus constructed piezoelectric/electrostrictive film element is not only used as an actuator, but may also be used as a sensor which detects a voltage signal which represents the amount of deflecting displacement of the diaphragm portion.

In the piezoelectric/electrostrictive film element constructed as described above, the crystal grain size and porosity of the P/E layers 42, and the deflection percentage of the diaphragm portions (26) are respectively controlled to be within the ranges as specified above, and the porosity and deflection percentage are also determined so as to satisfy the above-indicated formula (1).

While the piezoelectric/electrostrictive film element of the present invention can be advantageously used as an actuator or sensor for loudspeakers, display devices, servo-displacement elements, pulse-driven motors, ultrasonic motors, acceleration sensors or shock sensors, the present film element may also be advantageously used in other known applications.

[EXAMPLES]

To further clarify the present invention, some examples of the piezoelectric/electrostrictive film element of the present invention will be hereinafter described. However, it is to be understood that the present invention is not limited to details of the following examples, but may be embodied with various changes, modifications and improvements which may occur to those skilled in the art, without departing from the principle and scope of the invention as defined in the attached claims.

[Example 1]

Twenty samples of the piezoelectric/electrostrictive film elements were prepared by using a ceramic substrate 2 with the ten rectangular windows each having a size of 0.5 mm×0.7 mm. Therefore, the dimension m is 0.5 mm. The rectangular windows are arranged in the longitudinal direction of the substrate 2, such that the short sides (0.5 mm) of the windows are parallel to the longitudinal direction of the substrate 2, and such that the windows are spaced from each other by a spacing distance of 0.2 mm. Each ceramic substrate 2 had diaphragm portions 10 whose thickness value and amount of protrusion (h) are indicated in TABLE 1. Each sample was produced by preparing P/E layers 14 which had a ceramic powder filling a certain percentage of a green body for each layer 14 as indicated in TABLE 1, forming the P/E layers 14 on the respective diaphragm portions 10 of the ceramic substrate 2, and then firing the layers 14 at a firing temperature as indicated in TABLE 1. In this manner, the twenty samples of the piezoelectric/electrostrictive film elements were obtained.

In the piezoelectric/electrostrictive film element of each sample, the base plate 4 of the ceramic body 2 had a thickness of 200 μm, while the diaphragm plate 8 giving the diaphragm portions 10 had a thickness as indicated in TABLE 1. The base plate 4 and the diaphragm plate 8 were formed of zirconia which was partially stabilized by 3 mol % of yttria. To obtain the ceramic substrate 2 having an integral laminar structure of the base plate 4 and the diaphragm plate 8, green sheets for these plates 4, 8 were prepared in manners as described below, laminated and bonded under pressure, and then fired.

| Green Sheet for Base Plate 4 |  |
| --- | --- |
| zirconia powder partially stabilized by 3 mol % of 100 parts by weight yttria (average particle size 0.8 μm) | |
| polyvinyl butyral resin (binder) | 10 parts by weight |
| dibutyl phthalate (plasticizer) | 5 parts by weight |
| dispersing agent containing sorbitan | 2 parts by weight |
| solvent containing 50/50 of toluene and isopropyl alcohol | 73 parts by weight |

The above-indicated ingredients were blended in a pot mill with zirconia balls, to provide a slurry having the initial viscosity of 1,000 cps (centipoise). The thus obtained slurry was degassed under vacuum, and its viscosity was controlled to 10,000 cps. Then, the slurry was formed by doctor blade method into a green sheet which provides after firing the base plate 4 having a thickness of 200 μm. The green sheet was dried at 80° C. for three hours.

| Green Sheet for Diaphragm Plate 8 | |
| --- | --- |
| zirconia powder partially stabilized by 3 mol % of yttria (average particle size: 0.8 μm) | (100-z) parts by weight |
| alumina powder (average particle size: 0.2 μm) | z parts by weight |
| polyvinyl butyral resin (binder) | 9 parts by weight |
| dibutyl phthalate (plasticizer) | 4 parts by weight |

| Green Sheet for Diaphragm Plate 8 | |
| --- | --- |
| dispersing agent containing sorbitan | 2 parts by weight |
| solvent containing 50/50 of toluene and isopropyl alcohol | 70 parts by weight |

The above-indicated ingredients were blended in a pot mill with zirconia balls, to provide a slurry having the initial viscosity of 1,000 cps (centipoise). The thus obtained slurry was degassed under vacuum, and its viscosity was controlled to 3,000 cps. Then, the slurry was formed by a reverse roll coater machine into a green sheet which provides after firing the diaphragm portion 10 having a thickness as indicated in TABLE 1. The green sheet was dried at 80° C. for twenty minutes. The content of the alumina powder (z parts by weight) relative to that of the zirconia powder was varied as indicated below so as to vary the initial amount of protrusion (h) of the diaphragm portions 10 of the diaphragm plate 8.

| Amount of Protrusion (μm) | Content of Alumina (z parts by wt.) |
| --- | --- |
| 0 | 0 |
| 5 | 0.05 |
| 10 | 0.10 |
| 20 | 0.30 |
| 50 | 1.00 |

The thus obtained green sheet for the base plate 4 was punched according to a pattern by means of a suitable metal mold, so as to form the windows 6. Then, the green sheet was laminated on the green sheet for the diaphragm plate 8 produced as described above, and bonded thereto by thermocompression under the pressure of 100 Kg/cm$^2$ at 80° C. for 1 min. The thus obtained integral laminar structure was fired at 1500° C. for two hours, to provide the ceramic substrate 2 with the diaphragm portions 10 protruding outwards by the amount (h) as indicated in TABLE 1.

On the outer surface of each of the diaphragm portions 10 of the ceramic substrate 2 of each sample, a platinum paste was printed by screen printing, dried at 120° C. for 10 min., and fired at 1350° C. for two hours, to provide the lower electrode 12 having a thickness of 5 μm. Then, the piezoelectric/electrostrictive layer 14 of each sample as indicated in TABLE 1 was formed on the lower electrode 12 in the following manner. The P/E layer 14 was formed of a powder A of a piezoelectric/electrostrictive material which consisted of 38 mol % of lead magnesium niobate, 24 mol % of lead zirconate and 38 mol % of lead titantate, and in which a part of Pb was substituted by Sr and La. The powder A was formed into a paste, which was printed on the lower electrode 12 by screen printing, dried at 120° C. for 20 min., and then fired for two hours at a temperature as indicated in TABLE 1, to provide the P/E layer 14 having a thickness of 30 μm.

To form the paste for the P/E layer 14, there was prepared a composition as indicated below:

| | |
| --- | --- |
| powder A having the average particle size of 0.9 μm | 100 parts by weight |
| acrylic binder | 3 parts by weight |
| terpineol (solvent) | 20 parts by weight |

The composition was kneaded with three rollers to provide a paste having the viscosity of 100,000 cps. Then, the paste was printed by screen printing on the lower electrode 12, and dried at 120° C. for 20 min. to volatilize the solvent, thereby to provide the P/E layer (unfired) 14. After drying but before firing, 55% of the P/E layer 14 was filled with the powder of the piezoelectric/electrostrictive material (ceramic powder).

The filling percentage of the ceramic powder in the P/E layer 14 before its firing was increased in the following manner. That is, a part (10–30%) of the piezoelectric/ electrostrictive (P/E) powder A was substituted by another P/E powder having the same composition as the powder A and the average particle size of 0.3 μm. Then, the two kinds of P/E powders were thrown into a polyethylene pot with 10 mm-diameter zirconia balls, and crushed for three hours in a dry pot mill. The crushing operation was effected with 0.5 parts by weight of ethanol added as a crushing agent with respect to 100 parts by weight of the P/E powders. Then, 50 parts by weight of acetone was added with respect to 100 parts by weight of the P/E powders, and the mixture was wet-blended for five hours. Thereafter, 3 parts by weight of acrylic binder and 20 parts by weight of terpineol (solvent) were added, and wet-blended for one hour. Then thus obtained slurry was taken out of the pot, kept at 40° C. for 15 hours to evaporate the acetone, and then kneaded with three rollers to form a paste having the viscosity of 100,000 cps. The percentage of the thus obtained paste filled with the ceramic powder was measured and indicated below, which percentage varied depending upon the ratio of the P/E powder having the average particle size of 0.9 μm to the P/E powder having the average particle size of 0.3 μm. Thus, the P/E layers 14 of the samples as indicated in TABLE 1 were formed from respective pastes having different filling percentages of the ceramic powder.

| Combination of P/E powders | Ratio (% by weight) | Ceramic powder filling percentage |
|---|---|---|
| 0.9 μm/0.3 μm | 90/10 | 65% |
| 0.9 μm/0.3 μm | 80/20 | 70% |
| 0.9 μm/0.3 μm | 70/30 | 75% |

The filling percentage of the ceramic powder (powder of the piezoelectric/electrostrictive (P/E) material) is represented by (green density of the dried paste)×[(parts by weight of the P/E material)/(parts by weight of the P/E material+parts by weight of the binder)] ×(1/theoretical density of the P/E material)×100 (%).

Upon completion of the firing of the P/E layer 14, a Cr thin film was formed by sputtering on the P/E layer 14, and a Cu film was formed on the Cr thin film to form the upper electrode 16. Thus, the piezoelectric/electrostrictive film elements of the samples as indicated in TABLE 1 were obtained. The thus obtained film elements were subjected to polarization treatment by applying 100V between the upper and lower electrodes 16, 12 of each P/E unit 18.

For each sample of piezoelectric/electrostrictive film thus obtained, the amount of deflection of the diaphragm portion 10 and the crystal grain size and porosity of the P/E layer 14 were measured, while operating characteristics of the film element, such as the amount of displacement of each P/E layer 14 upon application of a voltage to the relevant P/E unit, were evaluated. The measurement results are indicated in TABLE 1.

More specifically, the amount of deflection of the diaphragm portion 10 was measured by electron microscope, at a middle portion of its cross section which was taken along the shortest line (m) passing the center of the window 6. The crystal grain size was obtained in the following manner. Initially, a cross section of the P/E layer 14 was ground and mirror-finished, and thermal etching was then conducted by an ordinary method so that the grain boundary appeared. The number of grains (n) and the area (S) of the grains in the field of view were measured by means of an electron microscope, and the grain size D=(4S/πn) was calculated. For measurement of the porosity, a cross section of P/E layer 14 was mirror-finished while avoiding removal of grains, and the area of pores or a hollow portion of the cross section within the area of the field of view was measured by an electron microscope, so as to calculate the porosity represented by (the area of the pores/the area of the field of view)×100 (%).

To evaluate the piezoelectric/electrostrictive characteristics, a voltage of 30V was applied between the upper and lower electrodes 16, 12 of each of the ten P/E units 18 of the film element of each sample, and the amount of displacement of the actuated P/E unit 18 was measured by a laser Doppler device. In this manner, all of the ten P/E units 18 were actuated one by one, and the first average of the displacements of these P/E units 18 was calculated. Similarly, a voltage of 30V was applied to all of the ten P/E units 18 of the film element of each sample, and the amounts of displacement of the respective P/E units 18 were measured. The second average of the displacements of the ten P/E units that were actuated at the same time was also calculated. Based on the thus obtained results was calculated the ratio (%) of the displacement measured upon actuation of all the P/E units to the displacement measured upon actuation of a single P/E unit as represented by (the second average/the first average)×100 (%).

It will be understood from TABLE 1 that the piezoelectric/electrostrictive film elements of samples No. 1 through No. 13 constructed according to the present invention provided relatively large amounts of displacement, with high uniformity in the amounts and quality, due to a reduced difference of the displacement amounts upon actuation of all of the P/E units 18 of the element from those upon actuation of a single P/E unit 18. It is to be noted that in the film elements of samples No. 1 through No. 13, the P/E layers 14 were formed as dense bodies having the crystal grain size and porosity within the ranges as specified by the present invention, and the middle portions of the diaphragm portions 10 (windows 6) were deflected by the amounts (d) in the ranges as specified by the present invention.

TABLE 1

| | Diaphragm Portion (10) | | | Piezoelectric/electrostrictive Layer (14) (P/E layer) | | | | Piezoelectric/electrostrictive (P/E) characteristics | |
|---|---|---|---|---|---|---|---|---|---|
| No | Thickness (μm) | Protrusion : h (μm) | Deflection: d (μm) | Firing Temp. (°C.) | Filling percentage of Ceramic powder (%) | Crystal grain size (μm) | Porosity (%) | Displacement (μm) | Whole actuation/ Single actuation (%) |
| 1 | 10 | 5 | 10 | 1250 | 55 | 2.1 | 9 | 0.24 | 90 |
| 2 | 10 | 10 | 7 | 1250 | 55 | 2.3 | 6 | 0.28 | 93 |
| 3 | 10 | 20 | 3 | 1250 | 55 | 2.4 | 7 | 0.29 | 100 |
| 4 | 12 | 20 | 8 | 1275 | 55 | 2.9 | 4 | 0.31 | 95 |
| 5 | 15 | 20 | 20 | 1300 | 55 | 3.4 | 3 | 0.28 | 90 |
| 6 | 6 | 20 | 7 | 1250 | 55 | 2.5 | 7 | 0.29 | 95 |
| 7 | 6 | 50 | 7 | 1250 | 55 | 2.4 | 5 | 0.33 | 97 |
| 8 | 10 | 0 | 20 | 1275 | 65 | 2.6 | 9 | 0.20 | 86 |
| 9 | 10 | 0 | 14 | 1250 | 70 | 1.9 | 10 | 0.23 | 90 |
| 10 | 10 | 0 | 8 | 1250 | 75 | 2.2 | 9 | 0.25 | 95 |
| 11 | 10 | 0 | 12 | 1275 | 75 | 2.5 | 8 | 0.26 | 92 |
| 12 | 10 | 10 | 4 | 1250 | 65 | 2.3 | 4 | 0.32 | 100 |
| 13 | 10 | 20 | 2 | 1250 | 65 | 2.4 | 3 | 0.32 | 100 |
| *14 | 10 | 0 | 26 | 1250 | 55 | 1.6 | 25 | 0.15 | 75 |
| *15 | 10 | 0 | 39 | 1275 | 55 | 2.3 | 16 | 0.18 | 70 |
| *16 | 10 | 0 | broken | 1300 | 55 | — | — | — | — |
| *17 | 6 | 0 | 42 | 1275 | 55 | 2.4 | 14 | 0.19 | 65 |
| *18 | 15 | 0 | 44 | 1300 | 55 | 2.9 | 14 | 0.11 | 65 |
| *19 | 15 | 0 | 63 | 1325 | 55 | 3.5 | 7 | 0.20 | 45 |
| *20 | 10 | 0 | 10 | 1225 | 55 | 1.2 | 30 | 0.11 | 75 |

*Comparative Example

On the other hand, the diaphragm portions 10 of the samples No. 14 through No. 20 as comparative examples had relatively large amounts of deflection, and relatively high porosity. It will be also understood from TABLE 1 that these film elements Nos. 14–20 provided relatively small displacement, and had a smaller ratio of the displacement amount measured upon actuation of the whole P/E units to that measured upon actuation of a single P/E unit. Thus, the elements of the comparative examples had deteriorated piezoelectric/electrostrictive characteristics and a great variation in their qualities. In preparing the element of sample No. 16, the firing temperature was raised so as to increase the density of the P/E layers 14. However, the diaphragm portions 10 having a small thickness were broken due to the high-temperature firing, and an intended element was not obtained. While the element of sample No. 19 was prepared by increasing the thickness of the diaphragm portions 10 to thus avoid breakage thereof during its firing at a high temperature (1325° C.), the portion 10 underwent a relatively large amount of deflection, resulting in insufficient piezoelectric/electrostrictive characteristics of the element. When the firing temperature was lowered to 1225° C. so as to reduce the deflection of the diaphragm portions 10, the porosity was increased, with a result of undesirably lowered density of the P/E layers 14. The thus obtained element was unsatisfactory in its piezoelectric/electrostrictive characteristics.

[Example 2]

Fifteen samples of piezoelectric/electrostrictive film elements having the same structure as those of Example 1 were prepared by using a powder B of a piezoelectric/electrostrictive material which had the average particle size of 0.4 μm, and consisted of 22 mol % of lead magnesium niobate, 15 mol % of lead nickel tantalate, 25 mol % of lead zirconate and 38 mol % of lead titanate, with a part of Pb substituted by Sr. In this case, a paste for forming the P/E layers 14 had the following composition:

| | |
|---|---|
| powder B having the average particle size of 0.4 μm | 100 parts by weight |
| polyvinyl butyral resin (binder) | 3 parts by weight |
| 2-ethyl hexanol (solvent) | 20 parts by weight |

The above composition was kneaded with three rollers, to provide a paste having the viscosity of 100,000 cps. This paste was printed by screen printing on the lower electrode 12 of each P/E unit 18, and dried at 120° C. for 20 min. to volatilize the solvent, thereby to provide the piezoelectric/electrostrictive layer 14 (unfired). Before firing, 50% of the dried P/E layer 14 was filled with the powder of the piezoelectric/electrostrictive material (ceramic powder).

In the same manner as in Example 1, the above-indicated powder B having the average particle size of 0.4 μm was blended with a powder of a piezoelectric/electrostrictive material having the same composition as the powder B and the average particle size of 0.1 μm, in the proportions as indicated below, so as to provide a paste having an increased filling percentage of the ceramic powder. Thus, the film element of each sample was produced.

| Combination of P/E powders | Ratio (% by weight) | Ceramic powder filling percentage |
|---|---|---|
| 0.4 μm/0.1 μm | 80/20 | 65% |
| 0.4 μm/0.1 μm | 70/30 | 70% |

With respect to the piezoelectric/electrostrictive element of each sample, the amount of deflection of the diaphragm portions 10, and the crystal grain size and porosity of the P/E layers 14 were measured, and the piezoelectric/electrostrictive characteristics were evaluated. The results of the measurement and evaluation are indicated in TABLE 2 below.

It will be understood from TABLE 2 that the piezoelectric/electrostrictive film elements of samples No.

21 through No. 30 constructed according to the present invention provided relatively large amounts of displacement, with high uniformity in the amounts and quality, due to a reduced difference of the displacement amounts by actuation of all of the P/E units 18 of the element from those by actuation of a single P/E unit 18. It is to be noted that in the film elements of samples No. 21 through No. 30, the P/E layers 14 were formed as dense bodies having the crystal grain size and porosity within the ranges as specified by the present invention, and the middle portions of the diaphragm portions 10 (windows 6) were deflected by the amounts (d) in the ranges as specified by the present invention.

line which extends across a corresponding one of said at least one window and passes a center of the window.

4. A method of producing a piezoelectric/electrostrictive film element including: a ceramic substrate having at least one window, and a diaphragm portion for closing each of said at least one window, said diaphragm portion being formed as an integral part of said ceramic substrate; and a piezoelectric/electrostrictive unit including a lower electrode, a piezoelectric/electrostrictive layer and an upper electrode, which are formed in the order of description on an outer surface of said diaphragm portion to provide a laminar structure, comprising the steps of:

TABLE 2

| | Diaphragm Portion (10) | | | Piezoelectric/electrostrictive Layer (14) (P/E layer) | | | | Piezoelectric/electrostrictive (P/E) characteristics | |
|---|---|---|---|---|---|---|---|---|---|
| No | Thickness (μm) | Protrusion : h (μm) | Deflection: d (μm) | Firing Temp. (°C.) | Filling percentage of Ceramic powder (%) | Crystal grain size (μm) | Porosity (%) | Displacement (μm) | Whole actuation/ Single actuation (%) |
| 21 | 10 | 5 | 19 | 1250 | 50 | 1.3 | 7 | 0.22 | 88 |
| 22 | 10 | 10 | 11 | 1250 | 50 | 1.8 | 4 | 0.28 | 93 |
| 23 | 10 | 20 | 6 | 1250 | 50 | 2.3 | 2 | 0.33 | 99 |
| 24 | 15 | 20 | 24 | 1300 | 50 | 3.4 | 3 | 0.29 | 89 |
| 25 | 6 | 20 | 5 | 1225 | 50 | 0.8 | 15 | 0.20 | 90 |
| 26 | 6 | 50 | 12 | 1275 | 50 | 2.5 | 0 | 0.34 | 95 |
| 27 | 6 | 10 | 35 | 1275 | 50 | 2.3 | 2 | 0.21 | 85 |
| 28 | 10 | 0 | 15 | 1250 | 65 | 1.2 | 11 | 0.21 | 87 |
| 29 | 10 | 0 | 10 | 1250 | 70 | 2.0 | 5 | 0.24 | 95 |
| 30 | 10 | 10 | 2 | 1250 | 65 | 2.5 | 1 | 0.34 | 99 |
| *31 | 10 | 0 | 28 | 1250 | 50 | 0.6 | 22 | 0.15 | 76 |
| *32 | 10 | 0 | 46 | 1275 | 50 | 1.8 | 10 | 0.17 | 65 |
| *33 | 10 | 0 | broken | 1300 | 50 | — | — | — | — |
| *34 | 6 | 0 | 39 | 1250 | 50 | 1.1 | 12 | 0.15 | 60 |
| *35 | 6 | 0 | 60 | 1275 | 50 | 2.0 | 7 | 0.20 | 40 |

*Comparative Example

What is claimed is:

1. A method of producing a piezoelectric/electrostrictive film element including: a ceramic substrate having at least one window, and a diaphragm portion for closing each of said at least one window, said diaphragm portion being formed as an integral part of said ceramic substrate; and a piezoelectric/electrostrictive unit including a lower electrode, a piezoelectric/electrostrictive layer and an upper electrode, which are formed in the order of description on an outer surface of said diaphragm portion to provide a laminar structure, comprising the steps of:

preparing said ceramic substrate in which said diaphragm portion protrudes outwards to provide a convex diaphragm portion;

forming said lower electrode and said piezoelectric/ electrostrictive layer on an outer surface of said convex diaphragm portion by a film-forming method;

firing said piezoelectric/electrostrictive layer so that said convex diaphragm portion is depressed into a corresponding one of said at least one window; and forming said upper electrode on said piezoelectric/ electrostrictive layer by a film-forming method.

2. A method as defined in claim 1, wherein said upper electrode is formed on said piezoelectric/electrostrictive layer before firing the piezoelectric/electrostrictive layer.

3. A method as defined in claim 1, wherein said diaphragm portion of said ceramic substrate protrudes outwards by an amount which is in a range of 1–20% of a length of a shortest preparing said ceramic substrate;

forming said lower electrode and said piezoelectric/ electrostrictive layer on said outer surface of said diaphragm portion by a film-forming method, said piezoelectric/electrostrictive layer including a ceramic powder which fills at least 60% of the piezoelectric/ electrostrictive layer before firing thereof;

firing said piezoelectric/electrostrictive layer; and forming said upper electrode on said piezoelectric/ electrostrictive layer by a film-forming method.

5. A method as defined in claim 4, wherein said upper electrode is formed on said piezoelectric/electrostrictive layer before firing the piezoelectric/electrostrictive layer.

6. A method as defined in claim 4, wherein said ceramic powder fills at least 65% of said piezoelectric/ electrostrictive layer before firing thereof.

7. A method as defined in claim 6, wherein said ceramic powder fills at least 70% of said piezoelectric/ electrostrictive layer before firing thereof.

8. A method of producing a piezoelectric/electrostrictive film element including: a ceramic substrate having at least one window, and a diaphragm portion for closing each of said at least one window, said diaphragm portion being formed as an integral part of said ceramic substrate; and a piezoelectric/electrostrictive unit including a lower electrode, a piezoelectric/electrostrictive layer and an upper electrode, which are formed in the order of description on an outer surface of said diaphragm portion to provide a laminar structure, comprising the steps of:

preparing said ceramic substrate in which said diaphragm portion protrudes outwards to provide a convex diaphragm portion;

forming said lower electrode and said piezoelectric/electrostrictive layer on an outer surface of said convex diaphragm portion by a film-forming method, said piezoelectric/electrostrictive layer including a ceramic powder which fills at least 60% of the piezoelectric/electrostrictive layer before firing thereof;

firing said piezoelectric/electrostrictive layer so that said convex diaphragm portion is depressed into a corresponding one of said at least one window; and forming said upper electrode on said piezoelectric/electrostrictive layer by a film-forming method.

9. A method as defined in claim 8, wherein said upper electrode is formed on said piezoelectric/electrostrictive layer before firing the piezoelectric/electrostrictive layer.

10. A method as defined in claim 8, wherein said diaphragm portion of said ceramic substrate protrudes outwards by an amount which is in a range of 1–20% of a length of a shortest line which extends across a corresponding one of said at least one window and passes a center of the window.

* * * * *